United States Patent
Bryant et al.

(10) Patent No.: US 9,312,274 B1
(45) Date of Patent: Apr. 12, 2016

(54) MERGED FIN STRUCTURES FOR FINFET DEVICES

(71) Applicant: INTERNATIONAL BUSINESS MACHINES CORPORATION, Armonk, NY (US)

(72) Inventors: Andres Bryant, Burlington, VT (US); Brian J. Greene, Wappingers Falls, NY (US); Jeffrey B. Johnson, Essex Junction, VT (US); Mickey H. Yu, Essex Junction, VT (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 14/514,900

(22) Filed: Oct. 15, 2014

(51) Int. Cl.
| | |
|---|---|
| *H01L 21/84* | (2006.01) |
| *H01L 27/088* | (2006.01) |
| *H01L 27/12* | (2006.01) |
| *H01L 21/02* | (2006.01) |
| *H01L 29/16* | (2006.01) |
| *H01L 29/161* | (2006.01) |

(52) U.S. Cl.
CPC ...... *H01L 27/1211* (2013.01); *H01L 21/02532* (2013.01); *H01L 21/845* (2013.01); *H01L 29/16* (2013.01); *H01L 29/161* (2013.01)

(58) Field of Classification Search
CPC ..... H01L 29/16; H01L 29/161; H01L 21/845; H01L 27/1211
USPC ............................ 257/401; 438/157, 300, 341
See application file for complete search history.

(56) References Cited

U.S. PATENT DOCUMENTS

| | | | |
|---|---|---|---|
| 7,300,837 B2 | 11/2007 | Chen et al. | |
| 8,362,574 B2 | 1/2013 | Kawasaki et al. | |
| 8,377,759 B2 | 2/2013 | Cheng et al. | |
| 8,466,450 B2 | 6/2013 | Shimamune et al. | |
| 8,525,186 B2 | 9/2013 | Cheng et al. | |
| 8,546,203 B1 | 10/2013 | Cheng et al. | |
| 8,564,064 B2 | 10/2013 | Cheng et al. | |
| 9,053,934 B2 * | 6/2015 | Chao ................. | H01L 29/66795 |
| 2011/0298058 A1 | 12/2011 | Kawasaki et al. | |
| 2013/0270611 A1 | 10/2013 | Adam et al. | |
| 2014/0134831 A1 * | 5/2014 | Chao ................. | H01L 29/66795 |
| | | | 438/478 |
| 2014/0203338 A1 * | 7/2014 | Kelly ................ | H01L 29/66795 |
| | | | 257/288 |

FOREIGN PATENT DOCUMENTS

| | | |
|---|---|---|
| JP | 2008277416 A | 11/2008 |
| JP | 2009032955 A | 2/2009 |

* cited by examiner

*Primary Examiner* — Long K Tran
(74) *Attorney, Agent, or Firm* — Michael LeStrange; Andrew M. Calderon; Roberts Mlotkowski Safran & Cole, P.C.

(57) ABSTRACT

Merged fin structures for finFET devices and methods of manufacture are disclosed. The method of forming the structure includes forming a plurality of fin structures on an insulator layer. The method further includes forming a faceted structure on adjacent fin structures of the plurality of fin structures. The method further includes spanning a gap between the faceted structures on the adjacent fin structures with a semiconductor material.

20 Claims, 5 Drawing Sheets

MERGED FIN STRUCTURES FOR FINFET DEVICES

FIELD OF THE INVENTION

The invention relates to semiconductor structures and, more particularly, to merged fin structures for finFET devices and methods of manufacture.

BACKGROUND

FinFET transistor technology allows designers and fabricators to increase the level of integration, while providing ever smaller devices. FinFET transistors possess electrostatic advantages over planar transistors and are expected to be the technology of choice for high performance logic applications for current and future VLSI semiconductor technologies.

In conventional finFET technologies, the transistor employs a gate structure spanning across fin structures, enabling multiple fins to function simultaneously as one transistor. Similarly, the sources and drains of the ensemble of fins forming the transistor must also be electrically connected, or merged, by some method. However, methods to connect the finfet sources and drains currently practiced have been found to be challenged by high source/drain series resistance compared to that observed in planar transistors. Further, finFET transistors, because of the additional, non-planar topology that provides their electrostatic advantage, will have high levels of parasitic capacitance which needs to be minimized for overall technology performance. The primary parasitic capacitance component is between the source/drain structures and the gate structure.

SUMMARY

In an aspect of the invention, a method of forming a structure comprises forming a plurality of fin structures on an insulator layer. The method further comprises forming a faceted structure on adjacent fin structures of the plurality of fin structures. The method further comprises spanning a gap between the faceted structures on the adjacent fin structures with a semiconductor material.

In an aspect of the invention, a method comprises: forming a plurality of fin structures; merging the plurality of fin structures together by forming faceted structures of semiconductor material on vertical sidewalls of adjacent ones of the plurality of fin structures; and forming semiconductor material on the faceted structures to fill a gap therebetween.

In an aspect of the invention, a structure comprises multiple fin structures on a substrate and a faceted structure provided on the one or more of the multiple fin structures, with a surface extending at an oblique angle relative to a vertical surface of the fin structures. The structure further comprises a semiconductor material provided on a surface of the faceted structure and extending between a gap of adjacent fin structures of the one or more fin structures. The structure further comprises a conductive region contacting the semiconductor material.

In another aspect of the invention, a design structure tangibly embodied in a machine readable storage medium for designing, manufacturing, or testing an integrated circuit is provided. The design structure comprises the structures of the present invention. In further embodiments, a hardware description language (HDL) design structure encoded on a machine-readable data storage medium comprises elements that when processed in a computer-aided design system generates a machine-executable representation of the merged finFET structures, which comprises the structures of the present invention. In still further embodiments, a method in a computer-aided design system is provided for generating a functional design model of the merged finFET structures. The method comprises generating a functional representation of the structural elements of the merged finFET structures.

BRIEF DESCRIPTION OF THE SEVERAL VIEWS OF THE DRAWINGS

The present invention is described in the detailed description which follows, in reference to the noted plurality of drawings by way of non-limiting examples of exemplary embodiments of the present invention.

DETAILED DESCRIPTION

The invention relates to semiconductor structures and, more particularly, to merged fin structures for finFET devices and methods of manufacture. More specifically, the present invention provides an approach to merging source and drain regions of multiple-fin transistors to simultaneously minimize both source/drain parasitic resistance and source/drain/gate parasitic capacitance to fully realize the performance advantages expected of finFET-based semiconductor technologies. In more specific embodiments, the present invention provides structures which connect or merge the source and drain regions of the fin structures together with a specific combination of epitaxially-grown and conformally and selectively deposited silicon in order to provide a low effective circuit resistance, Reff, and a low effective circuit capacitance, Ceff, solution to finFET technologies. Thus, the present invention provides a finFET device with a source/drain structure that provides both low series resistance and low capacitance.

In embodiments, the finFET structure of the present invention comprises multiple parallel fins, all using a same gate structure to form a single transistor. The source and drain of the transistor are tied together, e.g., merged, to electrically connect them together. In embodiments, the source and drain of the multiple fin structures are merged together using epitaxially grown silicon (e.g., faceted regions) on sidewalls of the fin structures, followed by a selective Si process to fill an intentionally allowed gap between the epitaxially grown silicon. The processes of the present invention are capable of absorbing contact (CA) etch and silicide formation variation, while providing a circuit Reff performance benefit with no circuit Ceff penalty.

The merged fin structures of the present invention can be manufactured in a number of ways using a number of different tools. In general, though, the methodologies and tools are used to form structures with dimensions in the micrometer and nanometer scale. The methodologies, i.e., technologies, employed to manufacture the merged fin structures of the present invention have been adopted from integrated circuit (IC) technology. For example, the structures of the present invention are built on wafers and are realized in films of material patterned by photolithographic processes on the top of a wafer. In particular, the fabrication of the merged fin structures of the present invention uses three basic building blocks: (i) deposition of thin films of material on a substrate, (ii) applying a patterned mask on top of the films by photolithographic imaging, and (iii) etching the films selectively to the mask.

Figure 1:
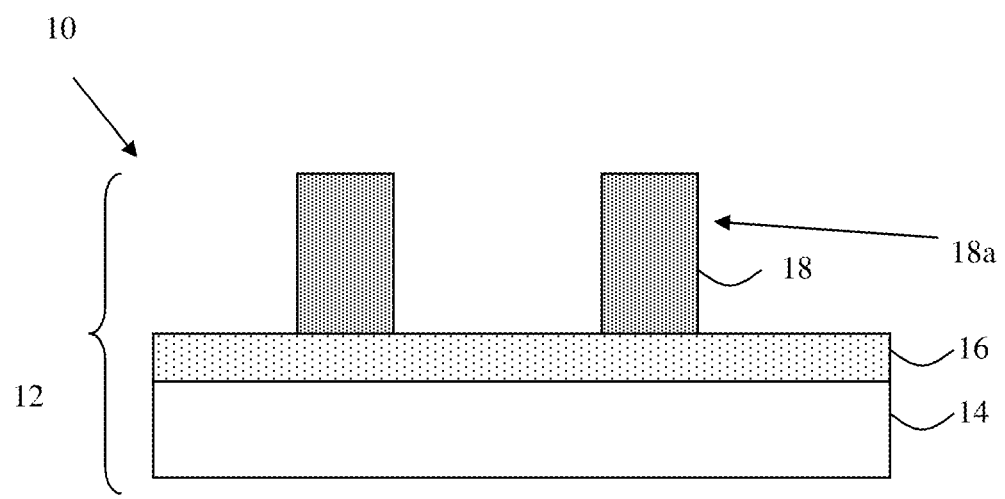
FIGS. 1-7 show structures and respective processing steps in accordance with aspects of the present invention.

FIG. 1 shows a structure and respective processing steps in accordance with aspects of the present invention. In particular, FIG. 1 shows a structure 10 comprising silicon on substrate (SOI) wafer 12. In embodiments, the SOI wafer 12 includes an insulator layer 16, e.g., buried oxide layer, formed on a wafer 14. A semiconductor layer 18a is formed on the insulator layer 16. Although not unique to SOI processes, the SOI wafer 10 can be formed using conventional methods such as, for example, SiMOX or bonding methods well known to those of skill in the art.

In embodiments, the semiconductor layer 18a can be silicon, for example, patterned to form fin structures 18. In embodiments, the fin structures 18 can be formed using conventional lithography and etching techniques, e.g., Reactive Ion Etching (RIE), known to those of skill in the art. The fin structures 18 can also be formed using sidewall image transfer (SIT) techniques. In SIT techniques, for example, a mandrel is formed on the semiconductor layer 18a, using conventional deposition, lithography and etching processes. The mandrel material, e.g., $SiO_2$, is deposited on the semiconductor layer 18a using conventional CVD processes. A resist is formed on the mandrel material, and exposed to light to form a pattern (openings). A reactive ion etching is performed through the openings to form the mandrels. In embodiments, the mandrels can have different widths and/or spacing depending on the desired dimensions between the fin structures 18 (using, e.g., a SIT-squared technique). Spacers are formed on the sidewalls of the mandrels which are preferably material that is different than the mandrels, and which are formed using conventional deposition processes known to those of skill in the art. The spacers can have a width which matches the dimensions of the fin structures 18, for example. The mandrels are removed or stripped using a conventional etching process, selective to the mandrel material. An etching is then performed within the spacing of the spacers to form the sub-lithographic features. The sidewall spacers can then be stripped.

Figure 2:
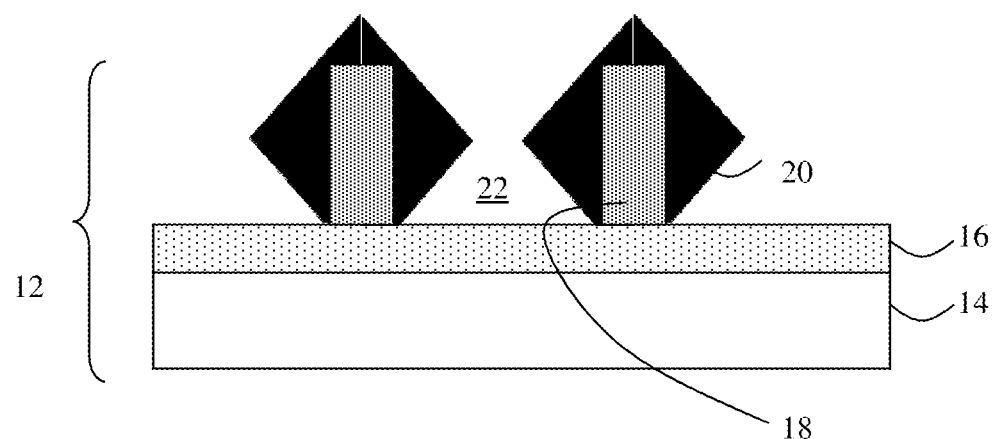

In FIG. 2, an epitaxial semiconductor material is grown on the sidewalls, e.g., vertical surfaces, of the fin structures 18 to from faceted structures 20. In embodiments, the epitaxial semiconductor material can be grown by a selective rapid thermal chemical vapor deposition epitaxial growth, with silicon and germanium precursors like silane, disilane, trisilane, dichlorosilae, germane, which can be in-situ doped with impurities supplied by additional gasses such as borane, diborane, etc. The growth regime (e.g., temperature, pressure, and partial pressures of silicon, germanium, dopant, carrier and etch gasses) is such that the crystal plane dependent growth rates are relatively high for epitaxy on <100> and <110> crystal planes, but very slow for <111> crystal planes. Growth times can range from, e.g., 30-200 seconds; although growth time is tunable with temperature and pressure as should be understood by those of skill in the art.

The faceted structures 20 include a surface extending at an oblique angle relative to the side of the fin structures 18. In embodiments, the epitaxial semiconductor material is grown on source and drain regions of a gated structure (see, e.g., FIGS. 6 and 7). The growth process is also provided on the vertical surfaces of the fin structures 18, with a resulting gap or space 22 being formed between adjacent fin structures 18. Advantageously, the epitaxial growth process avoids any defects that are typically created in conventional merged structures in which the facets are grown until adjacent facets coalesce. By avoiding the defects known to occur when adjacent facets merge, a more manufacturable process is achieved.

Still referring to FIG. 2, the semiconductor material used to form the faceted structures 20 can be, for example, Si or SiGe depending on the desired characteristics of the FET. Specifically, in embodiments, for a NFET, Si is grown on the vertical surfaces of the fin structures 18; whereas, for a PFET, SiGe is grown on the vertical surfaces of the fin structures 18.

Figure 3:
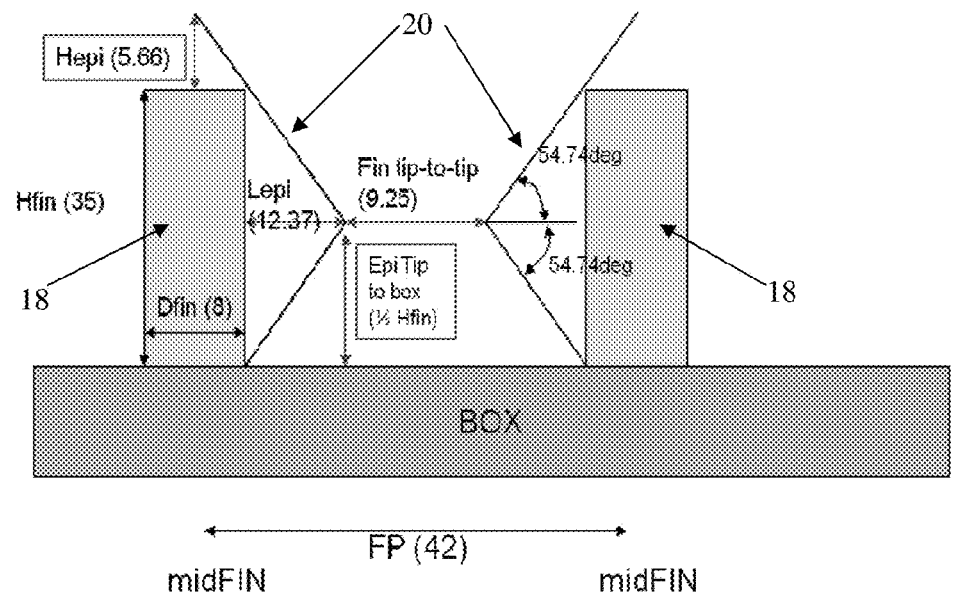

FIG. 3 shows an exemplary structure fabricated in accordance with aspects of the present invention. Also, as should be understood by those of skill in the art, the growth process naturally provides a faceted structure on the surfaces of the fin structures 18, which may be fixed based on the dimensions of the fin structures 18. In the non-limiting representation of FIG. 3, the height of the fin structure 18 (Hfin) is 35 nm, with the thickness (Dfin) being 8 nm. The fin structures 18 have a distance, from center, of approximately 42 nm. The faceted structure 20 will have an angle of approximately 54.74 degrees, with a lateral distance of about 12.37 nm. The distance between the tips of the faceted structure 20 is about 9.25 nm, with a height above the fin structure 18 (Hepi) being about 5.66 nm. In embodiments, the present invention also contemplates that the faceted structure 20 will not extend above a top surface of the fin structure 18. The tips of the faceted structure 20 are approximately half the height of the fin structures 18. It should be understood by those of skill in the art, thought, that the Structure of FIG. 3 is merely one example structure and that other structures with different dimensions are also contemplated by the present invention and that the complex details of the actual growth process will result in small variations around this target structure.

Figure 4:
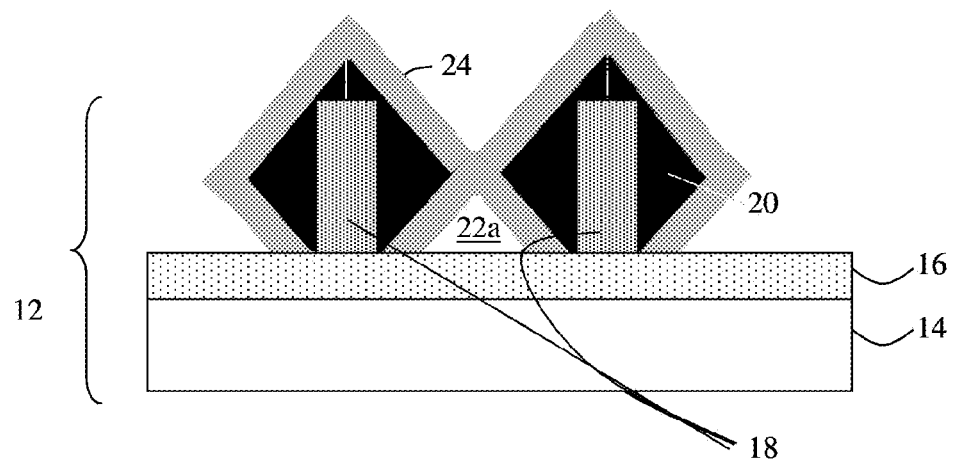

In FIG. 4, Si cap 24 is formed on the faceted structures 20, spanning the gap 22. In embodiments, the Si cap 24 is formed by a selective deposition process, in order to merge fin structures 18 together. The growth process can also be a selective rapid thermal chemical vapor deposition epitaxial growth, which preferentially fills concave surfaces. The Si cap 24 is formed of such thickness to pinch off the gap between the faceted structures 20, leaving a space 22a underneath the Si cap 24.

Figure 5:
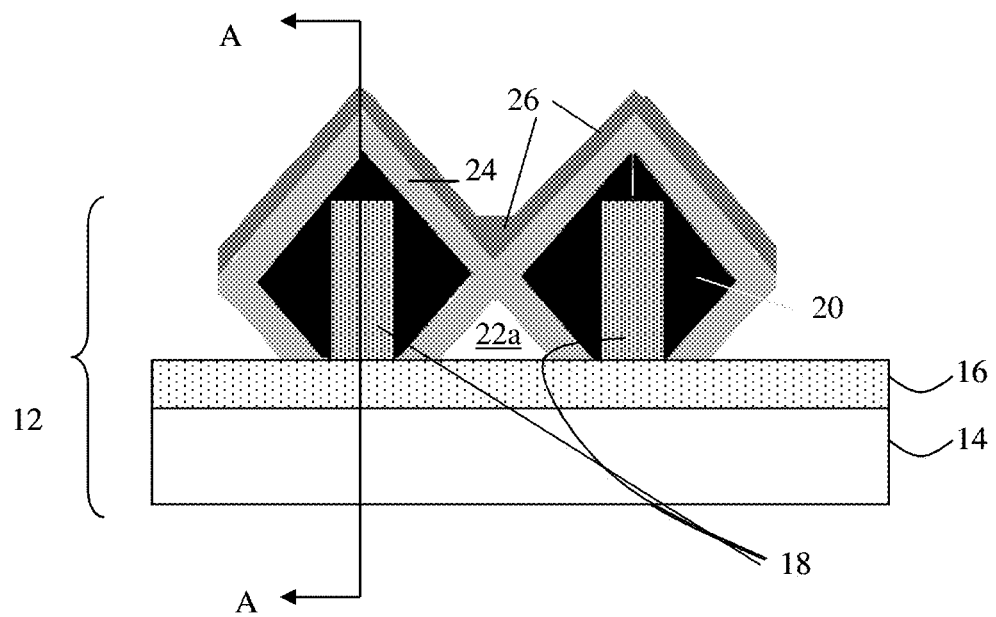

FIG. 5 depicts the continued growth of Si cap 24. Since the Si cap 24 has now pinched off the opening 22, the additional silicon 26 is deposited only on the top facets. As noted, the growth process is a selective rapid thermal chemical vapor deposition epitaxial growth which preferentially fills concave surface. In this way, the source and drain regions of fin structures 18 can be merged together with low resistance silicon with the region of least thickness, the valley formed by the two proximate facet tips, receiving an additional thickness of silicon which provides additional low resistance material to both absorb silicide thickness variations as well as provide a region to be recessed and then filled with silicide, providing additional silicide/silicon resistance reduction. Also, advantageously, the use of the additional deposited Si cap 26 provides a mechanism of resistance reduction with minor concomitant capacitance penalty, as described herein.

Figure 6:
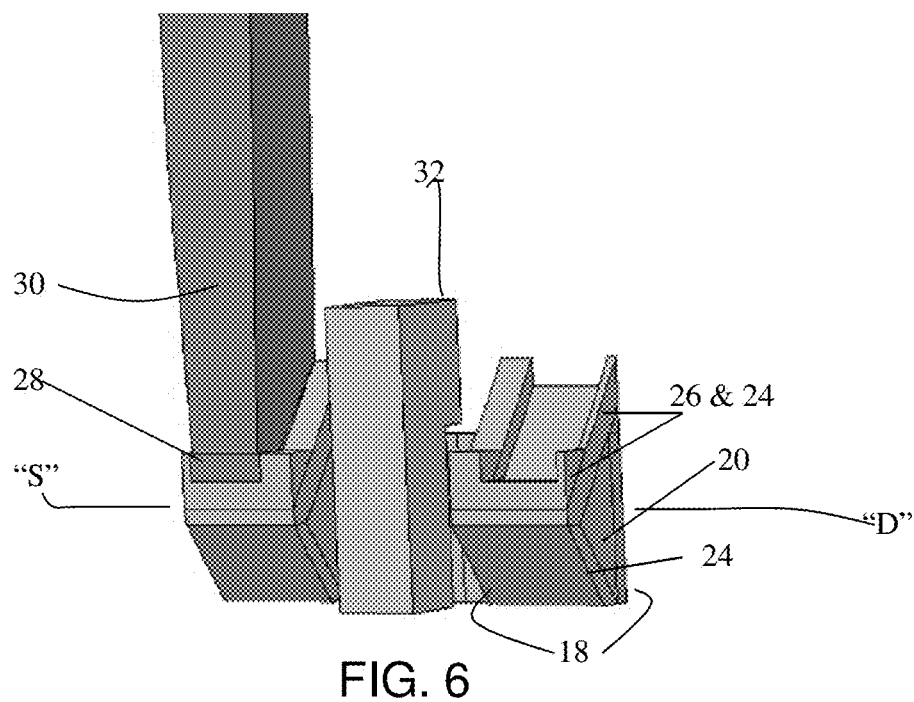

FIG. 6 is a perspective view of the structure of FIG. 5, along lines A-A, as it would appear at the end of the transistor formation with all necessary transistors features in place. FIG. 6 shows half of a single fin that is part of a transistor composed of a plurality of fins. The structure in FIG. 6 is truncated at the fin center and at the fin pitch. As shown in this representation, the insulator materials have been removed to show only the transistor gate, the fin, the merged source/drain and the silicide and local interconnect (CA) structure on the source side of the transistor.

In particular, FIG. 6 shows a gate formation process (which gate is formed prior to the formation of the merging of the source and drain regions of the fin structures 18) and contact (CA) formation process (which is formed subsequent to the merging of the fin structures 18). Advantageously, the processes of merging the fin structures 18, as herein disclosed, allows existing silicide formation expertise, optimized over many generations of planar VLSI technology development, to be used for finFET technologies. Also, taking FIGS. 3 and 4 together, as the cap layers 26 and 24 are conformally recessed through the combination of etch and silicidation, the surface area of the metal/silicide interface has been increased. The increase in surface area arises from two features of the merged structure described herein: (i) the cap layers 24 and 26 form a sloped surface, as it lies on the sloped surface of the faceted structure 20, and (ii) the silicide can be formed in a recessed area of the Si cap 24 and 26, and thus contacts both the sidewalls and bottom of the recessed silicon cap and facet. This feature of the invention described herein effectively increases the silicon/silicide contact area compared to conventional structures merged source/drain structures with a horizontal surface. The increase in the surface area will thus reduce series resistance through reduction of the unavoidable, finite silicide-to-silicon contact resistivity. That is, the increased metal to silicon surface area decreases the overall resistance of the structure.

Figure 7:
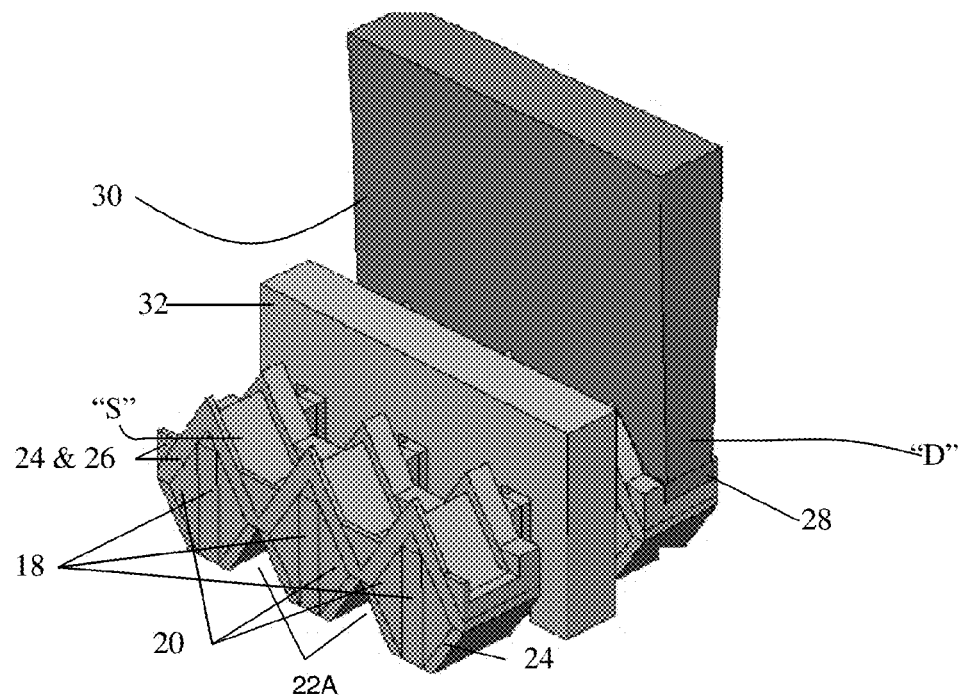

In FIGS. 6 and 7, as the gap between the faceted structures fills with the Si cap material, the conducting surface, i.e. epitaxial silicon, silicide and contact metal, interacting with the gate structure 32 stays essentially constant. This important feature of the invention arises as follows: This surface area generating the gate/drain and gate/source capacitance consists of two components: (i) the material directly facing the vertical surface of the gate material, region 32, composed of regions 20, 24, 26 and 30; and (ii) the top surface of region 26. As the silicon cap grows on the original faceted regions the vertical surface facing the gate material increases in extent while the top surface decreases in extent. Another important feature of the invention that acts to reduce the capacitance is region 22A in FIGS. 5 and 7. Once the silicon film 26 merges the source and drains no additional material grows between the merged facets. This void also acts to reduces gate/drain and gate/source capacitance.

FIG. 7 shows the structure of the present invention with multiple fins, e.g., in a system of three (3) fins within a multi-fin structure. For purposes of explanation, the source 'S' suicide and metal contact structures are omitted. As shown in the combination of FIGS. 6 and 7, in embodiments, the source "S" and drain "D" of the finFET transistor sections are doped using conventional doping processes, e.g., in situ doping of the semiconductor and ion implantation including extension and halo implants as should be understood by those of skill in the art, and the gate structure 32 is formed using conventional deposition, lithography and etching (RIE) processes. More specifically, the gate structure 32 can be formed by deposition of a dielectric material (e.g., high-k dielectric material such as, for example, a hafnium based material) and different gate materials (e.g., a workfunction metal followed by polysilicon or other metals), depending on the desired performance characteristics of the transistor. The dielectric material and gate materials can be patterned using conventional lithography and etching processes, which should be understood by those of skill in the art such that no further discussion is required herein for an understanding of the present invention. In this way, the gate structure 32 will span multiple fin structures 18 as shown in FIG. 7.

Referring to FIGS. 3-7, contact formation includes forming a silicide layer 28 on the Si cap 24 and 26, (e.g., source "S", drain "D"), followed by metal deposition and patterning to form the contact 30. The silicide layer 28 can be formed by a deposition of metal, e.g., nickel or other transition metal, on the Si cap 24, followed by an annealing process, e.g., temperatures of about 250° C. to 350° C. Thereafter, the contact 30 can be formed on the silicide layer 28, by deposition of a metal, e.g., tungsten, copper, etc., followed by conventional lithography and etching (RIE) processes, which should be understood by those of skill in the art. In embodiments, the additional thickness of epitaxial silicon 26, which forms preferentially in the concave regions where adjacent epitaxial facets are closest, (shown in FIGS. 5, 6 and 7) is very effective in absorbing the contact (CA) etch and silicide formation variation.

Detailed simulations have found that the resulting fringe capacitance between the gate material and the two surfaces of the epitaxial facet and deposited cap material increase very slowly with the thickness of the cap region. The increased thickness of the cap material, however, provides room for the silicide to be recessed into the cap structure and facet. This recess provides increased surface area between the silicide and the semiconductor, thus reducing the transfer resistance between the silicide and semiconductor. This advantageous tradeoff between significantly reduced resistance and negligibly increased capacitance, as observed in detailed electrical simulation, is shown in FIG. 8.

Figure 8:
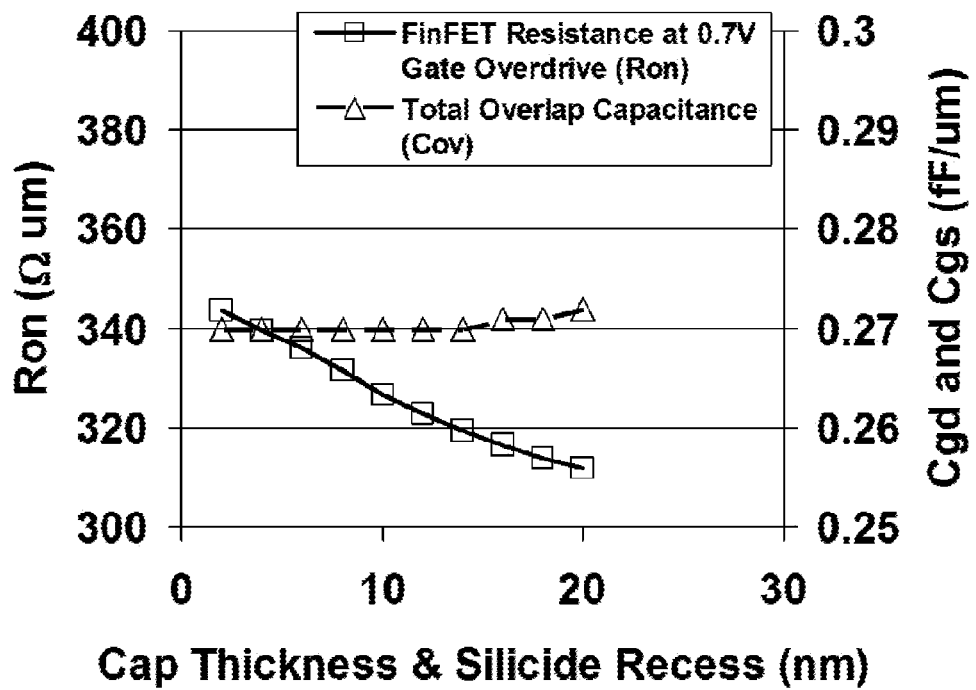
FIG. 8 shows a performance graph of the favorable resistance and capacitance performance tradeoff observed in the present invention.

FIG. 8 shows a performance graph of the fundamental tradeoff between device source-to-drain resistance at large gate overdrive (threshold voltage plus a constant voltage offset, in this case +0.7V) and low drain-to-source voltage (in this case 0.05V), Ron, and gate-to-source, Cgs, and gate-to-drain, Cgd, capacitance, as implemented by the present invention. In FIG. 8 the right y-axis, Cgd and Cgs, is the capacitance between the transistor gate and either the source or the drain in a completely fabricated transistor as the silicon cap is increased and the silicide recessed equivalently. Also in FIG. 8 the left y-axis, Ron, is the total resistance from source to drain in the transistor when the gate is strongly inverted electrically and there is a small source to drain bias applied. Thus, as shown, the capacitance between the gate structure and drain increases very slowly with the thickness of the silicon cap 24 and 26 in FIGS. 5, 6 and 7. However, the silicon/silicide surface area has increased with the thickness of the silicide cap, as explained above, thus reducing the component of series resistance due to silicide contact resistivity.

Figure 9:
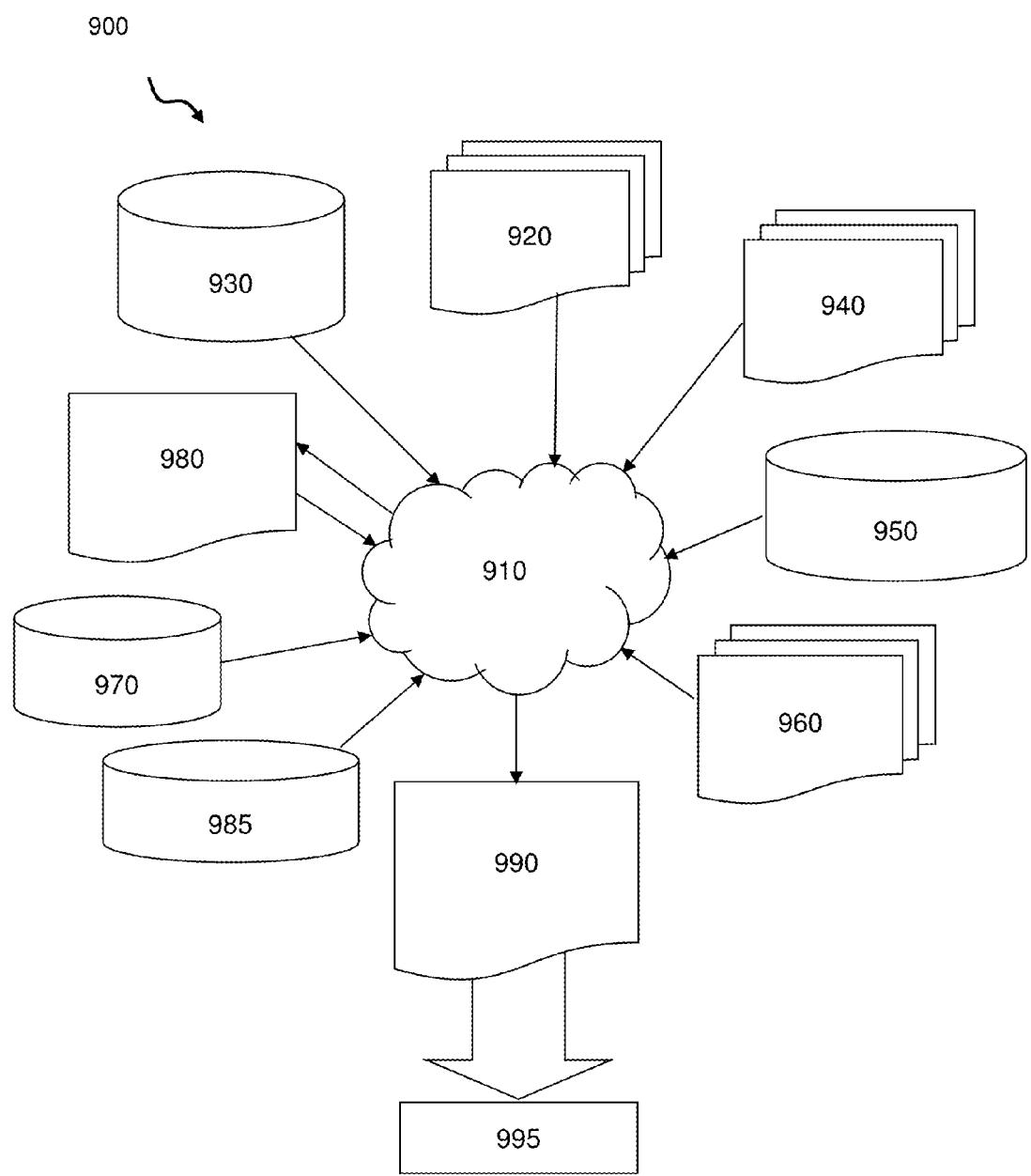
FIG. 9 is a flow diagram of a design process used in semiconductor design, manufacture, and/or test.

FIG. 9 is a flow diagram of a design process used in semiconductor design, manufacture, and/or test. FIG. 9 shows a block diagram of an exemplary design flow 900 used for example, in semiconductor IC logic design, simulation, test, layout, and manufacture. Design flow 900 includes processes, machines and/or mechanisms for processing design structures or devices to generate logically or otherwise functionally equivalent representations of the design structures and/or devices described above and shown in FIGS. 1-7. The design structures processed and/or generated by design flow 900 may be encoded on machine-readable transmission or storage media to include data and/or instructions that when executed or otherwise processed on a data processing system generate a logically, structurally, mechanically, or otherwise functionally equivalent representation of hardware components, circuits, devices, or systems. Machines include, but are not limited to, any machine used in an IC design process, such as designing, manufacturing, or simulating a circuit, component, device, or system. For example, machines may include:

lithography machines, machines and/or equipment for generating masks (e.g. e-beam writers), computers or equipment for simulating design structures, any apparatus used in the manufacturing or test process, or any machines for programming functionally equivalent representations of the design structures into any medium (e.g. a machine for programming a programmable gate array).

Design flow 900 may vary depending on the type of representation being designed. For example, a design flow 900 for building an application specific IC (ASIC) may differ from a design flow 900 for designing a standard component or from a design flow 900 for instantiating the design into a programmable array, for example a programmable gate array (PGA) or a field programmable gate array (FPGA) offered by Altera® Inc. or Xilinx® Inc.

FIG. 9 illustrates multiple such design structures including an input design structure 920 that is preferably processed by a design process 910. Design structure 920 may be a logical simulation design structure generated and processed by design process 910 to produce a logically equivalent functional representation of a hardware device. Design structure 920 may also or alternatively comprise data and/or program instructions that when processed by design process 910, generate a functional representation of the physical structure of a hardware device. Whether representing functional and/or structural design features, design structure 920 may be generated using electronic computer-aided design (ECAD) such as implemented by a core developer/designer. When encoded on a machine-readable data transmission, gate array, or storage medium, design structure 920 may be accessed and processed by one or more hardware and/or software modules within design process 910 to simulate or otherwise functionally represent an electronic component, circuit, electronic or logic module, apparatus, device, or system such as those shown in FIGS. 1-7. As such, design structure 920 may comprise files or other data structures including human and/or machine-readable source code, compiled structures, and computer-executable code structures that when processed by a design or simulation data processing system, functionally simulate or otherwise represent circuits or other levels of hardware logic design. Such data structures may include hardware-description language (HDL) design entities or other data structures conforming to and/or compatible with lower-level HDL design languages such as Verilog and VHDL, and/or higher level design languages such as C or C++.

Design process 910 preferably employs and incorporates hardware and/or software modules for synthesizing, translating, or otherwise processing a design/simulation functional equivalent of the components, circuits, devices, or logic structures shown in FIGS. 1-7 to generate a netlist 980 which may contain design structures such as design structure 920. Netlist 980 may comprise, for example, compiled or otherwise processed data structures representing a list of wires, discrete components, logic gates, control circuits, I/O devices, models, etc. that describes the connections to other elements and circuits in an integrated circuit design. Netlist 980 may be synthesized using an iterative process in which netlist 980 is resynthesized one or more times depending on design specifications and parameters for the device. As with other design structure types described herein, netlist 980 may be recorded on a machine-readable data storage medium or programmed into a programmable gate array. The medium may be a non-volatile storage medium such as a magnetic or optical disk drive, a programmable gate array, a compact flash, or other flash memory. Additionally, or in the alternative, the medium may be a system or cache memory, buffer space, or electrically or optically conductive devices and materials on which data packets may be transmitted and intermediately stored via the Internet, or other networking suitable means.

Design process 910 may include hardware and software modules for processing a variety of input data structure types including netlist 980. Such data structure types may reside, for example, within library elements 930 and include a set of commonly used elements, circuits, and devices, including models, layouts, and symbolic representations, for a given manufacturing technology (e.g., different technology nodes, 32 nm, 45 nm, 90 nm, etc.). The data structure types may further include design specifications 940, characterization data 950, verification data 960, design rules 970, and test data files 985 which may include input test patterns, output test results, and other testing information. Design process 910 may further include, for example, standard mechanical design processes such as stress analysis, thermal analysis, mechanical event simulation, process simulation for operations such as casting, molding, and die press forming, etc. One of ordinary skill in the art of mechanical design can appreciate the extent of possible mechanical design tools and applications used in design process 910 without deviating from the scope and spirit of the invention. Design process 910 may also include modules for performing standard circuit design processes such as timing analysis, verification, design rule checking, place and route operations, etc.

Design process 910 employs and incorporates logic and physical design tools such as HDL compilers and simulation model build tools to process design structure 920 together with some or all of the depicted supporting data structures along with any additional mechanical design or data (if applicable), to generate a second design structure 990.

Design structure 990 resides on a storage medium or programmable gate array in a data format used for the exchange of data of mechanical devices and structures (e.g., information stored in a IGES, DXF, Parasolid XT, JT, DRG, or any other suitable format for storing or rendering such mechanical design structures). Similar to design structure 920, design structure 990 preferably comprises one or more files, data structures, or other computer-encoded data or instructions that reside on transmission or data storage media and that when processed by an ECAD system generate a logically or otherwise functionally equivalent form of one or more of the embodiments of the invention shown in FIGS. 1-7. In one embodiment, design structure 990 may comprise a compiled, executable HDL simulation model that functionally simulates the devices shown in FIGS. 1-7.

Design structure 990 may also employ a data format used for the exchange of layout data of integrated circuits and/or symbolic data format (e.g. information stored in a GDSII (GDS2), GL1, OASIS, map files, or any other suitable format for storing such design data structures). Design structure 990 may comprise information such as, for example, symbolic data, map files, test data files, design content files, manufacturing data, layout parameters, wires, levels of metal, vias, shapes, data for routing through the manufacturing line, and any other data required by a manufacturer or other designer/developer to produce a device or structure as described above and shown in FIGS. 1-7. Design structure 990 may then proceed to a stage 995 where, for example, design structure 990: proceeds to tape-out, is released to manufacturing, is released to a mask house, is sent to another design house, is sent back to the customer, etc.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A method of forming a structure, comprising:
   forming a plurality of fin structures on an insulator layer;
   forming a faceted structure on adjacent fin structures of the plurality of fin structures, wherein adjacent faceted structures define a gap therebetween;
   spanning the gap between the adjacent faceted structures with a first semiconductor material; and
   forming a semiconductor cap material over the first semiconductor material to provide at least additional thickness over the gap thereby absorbing silicide thickness variations and providing a region to be recessed and then filled with silicide.

2. The method of claim 1, wherein the forming of the faceted structures is a growth process on vertical sidewalls of the adjacent fin structures, which leaves the gap between the adjacent faceted structures.

3. The method of claim 2, wherein the spanning of the gap between the adjacent faceted structures on the adjacent fin structures comprises a selective deposition of the first semiconductor material on sloped surfaces of the faceted structures, and the first semiconductor material is formed on all surfaces of the adjacent faceted structures and the second semiconductor material is formed only on upper surfaces of the adjacent faceted structures, directly on the first semiconductor material.

4. The method of claim 3, wherein the fin structures and the faceted structures are formed from a second semiconductor material.

5. The method of claim 4, wherein the third semiconductor material of the faceted structures is Si for NFET technologies and SiGe for PFET technologies.

6. The method of claim 1, wherein the fin structures are formed from a semiconductor layer of a silicon on insulator (SOI) wafer.

7. The method of claim 1, further comprising forming a contact over the semiconductor cap material which is spanning the gap between the faceted structures on the adjacent fin structures.

8. The method of claim 7, wherein the faceted structure in combination with the first semiconductor material and the semiconductor cap material both of which are spanning the gap comprises merging source and drain regions of the adjacent fin structures for a single gate structure.

9. A method, comprising:
   forming a plurality of adjacent fin structures;
   merging the plurality of adjacent fin structures together comprising:
   forming faceted structures of semiconductor material on vertical sidewalls of the adjacent fin structures, wherein adjacent faceted structures define a gap therebetween; and
   forming a first semiconductor material on the adjacent faceted structures to fill the gap; and
   forming a semiconductor cap material over the first semiconductor material to provide at least additional thickness over the gap thereby absorbing silicide thickness variations and providing a region to be recessed and then filled with silicide.

10. The method of claim 9, wherein the forming of the faceted structures comprises an epitaxial growth process.

11. The method of claim 9, wherein the forming the first semiconductor material on the faceted structures comprises a selective deposition process which deposits the first semiconductor material to a thickness which pinches off the gap, leaving a space underneath, and the first semiconductor material is formed on all surfaces of the adjacent faceted structures and the semiconductor cap material is formed only on upper surfaces of the adjacent faceted structures, directly on the first semiconductor material.

12. The method of claim 9, wherein:
   the fin structures and the faceted structures are formed from a second semiconductor material; and
   the second semiconductor material of the faceted structures is Si for NFET technologies and SiGe for PFET technologies.

13. The method of claim 12, further comprising forming a contact over the first and the second semiconductor material which are spanning the gap between the faceted structures on the adjacent fin structures, and the first semiconductor material is formed on all surfaces of the adjacent faceted structures and the semiconductor cap material is formed only on upper surfaces of the adjacent faceted structures, directly on the first semiconductor material.

14. The method of claim 13, wherein the first semiconductor material and the semiconductor cap material are provided over a sloped surface of the faceted structures effectively increasing a contact area for the contact, compared to a horizontal surface.

15. The method of claim 14, further comprising forming a silicide between the first semiconductor material and the semiconductor cap material formed on the sloped surface and the contact.

16. The method of claim 9, wherein the faceted structure in combination with the first semiconductor material spanning the gap comprises merging source and drain regions of the adjacent fin structures to form a single gate structure.

17. The method of claim 9, wherein the plurality of adjacent fin structures are formed from a semiconductor layer of a silicon on insulator (SOI) wafer.

18. A structure, comprising:
   one or more adjacent fin structures on a substrate;
   a faceted structure provided on the one or more adjacent fin structures, with a surface extending at an oblique angle relative to a vertical surface of the fin structures, wherein adjacent faceted structures define a gap therebetween;
   a first semiconductor material provided on a surface of the faceted structure and extending between and closing the gap of adjacent faceted structures;

a semiconductor cap material provided over the first semiconductor material and over the closed gap; and a conductive region contacting the semiconductor cap material.

19. The structure of claim 18, wherein the faceted structure is a third semiconductor material.

20. The structure of claim 18, wherein the first semiconductor material pinches off the gap to form a space below, and the first semiconductor material is provided on all surfaces of the adjacent faceted structures and the semiconductor cap material is provided only on upper surfaces of the adjacent faceted structures, directly on the first semiconductor material.

\* \* \* \* \*